US012614604B2

(12) United States Patent
Stainer et al.

(10) Patent No.: US 12,614,604 B2
(45) Date of Patent: Apr. 28, 2026

(54) DEVICE AND METHOD FOR TESTING MEMORY

(71) Applicant: HPROBE, Eybens (FR)

(72) Inventors: Quentin Stainer, Eybens (FR); Marco Mansueto, Eybens (FR); Siamak Salimy, Eybens (FR)

(73) Assignee: HPROBE, Eybens (FR)

( * ) Notice: Subject to any disclaimer, the term of this patent is extended or adjusted under 35 U.S.C. 154(b) by 48 days.

(21) Appl. No.: 18/714,426

(22) PCT Filed: Dec. 5, 2022

(86) PCT No.: PCT/EP2022/084463
§ 371 (c)(1),
(2) Date: May 29, 2024

(87) PCT Pub. No.: WO2023/104735
PCT Pub. Date: Jun. 15, 2023

(65) Prior Publication Data
US 2025/0022531 A1　　Jan. 16, 2025

(30) Foreign Application Priority Data

Dec. 7, 2021　(FR) ...................................... 2113056

(51) Int. Cl.
*G11C 29/50*　　(2006.01)
(52) U.S. Cl.
CPC .............................. *G11C 29/50004* (2013.01)
(58) Field of Classification Search
CPC ........ G11C 29/50004; G11C 29/12005; G11C 29/1201; G11C 29/14; G11C 29/30;
(Continued)

(56) References Cited

U.S. PATENT DOCUMENTS 7,197,684 B2 * 3/2007 Fang ...................... G11C 29/48
714/724
10,885,989 B1 * 1/2021 Moon ........................ H03F 3/45
(Continued)

OTHER PUBLICATIONS

Written Opinion for PCT/EP2022/084463 mailed Feb. 28, 2023. (English Translation).
(Continued)

*Primary Examiner* — James C Kerveros
(74) *Attorney, Agent, or Firm* — Perilla Knox & Hildebrandt LLP; Jason M. Perilla

(57) ABSTRACT

The present description concerns a device (100) for testing a resistance-change memory cell (10), comprising:
a conductive element (108) adapted to coupling the cell to the device;
a generator of signals (102) for writing into and reading from the cell;
a first transmission line (104) adapted to coupling the generator and the conductive element to transmit a write signal;
a second transmission line (106) adapted to coupling the generator and the conductive element to transmit a read signal;
an amplifier (110) comprising a detection resistor (112) positioned on the second transmission line;
an acquisition unit (130) coupled to the output of the amplifier; and
a switching module (120) adapted to coupling the generator and the conductive element via the first transmission line or via the second transmission line.

17 Claims, 3 Drawing Sheets

(58) Field of Classification Search
CPC . G11C 29/32; G11C 29/48; G11C 2029/3202;
G11C 29/50008; G11C 29/50012; G11C
29/56016; G11C 29/56008; G11C
2029/5602; G11C 29/56012
USPC ......................................................... 714/721
See application file for complete search history.

(56)                   References Cited

U.S. PATENT DOCUMENTS

| | | | |
|---|---|---|---|
| 2005/0030814 A1* | 2/2005 | Oh | G11C 7/06 |
| | | | 365/222 |
| 2006/0126412 A1 | 6/2006 | Maki | |
| 2007/0140033 A1 | 6/2007 | Yang et al. | |
| 2011/0185259 A1* | 7/2011 | Seo | G11C 11/005 |
| | | | 714/763 |
| 2011/0235403 A1* | 9/2011 | Kang | G11C 29/50 |
| | | | 365/148 |
| 2015/0036415 A1 | 2/2015 | Di Pendina et al. | |
| 2015/0078081 A1* | 3/2015 | Zhou | G11C 29/021 |
| | | | 365/185.21 |
| 2017/0186469 A1 | 6/2017 | Kim et al. | |
| 2017/0256324 A1 | 9/2017 | Kagami et al. | |
| 2020/0025824 A1 | 1/2020 | Zhao et al. | |
| 2024/0119983 A1* | 4/2024 | Kim | G11C 11/1675 |

OTHER PUBLICATIONS

International Search Report and Written Opinion for PCT/EP2022/
084463 mailed Feb. 28, 2023.

* cited by examiner

DEVICE AND METHOD FOR TESTING MEMORY

CROSS-REFERENCE TO RELATED APPLICATIONS

The present application is a 35 U.S.C. § 371 national stage patent application of Patent Cooperation Treaty application number PCT/EP2022/084463, filed Dec. 5, 2022, titled "DEVICE AND METHOD FOR TESTING MEMORY," which claims the benefit of and priority to French patent application number 2113056, filed on Dec. 7, 2021, entitled "Dispositif et procédé de test mémoire", the entire contents of each of which are hereby incorporated herein by reference.

The present application is based on, and claims priority from, French patent application 2113056 filed on Dec. 7, 2021, entitled "Dispositif et procédá de test mémoire", which is incorporated by reference to the extent permitted by law.

TECHNICAL BACKGROUND

The present disclosure generally concerns techniques for testing memories which use distinct resistance states to store data (resistance-change memories), such as a magnetic random access memory (MRAM), a phase-change RAM memory (PCRAM), a resistive RAM memory (RRAM), or a memristor. The present disclosure particularly concerns tests in high-frequency pulsed mode of such memories, for example, for the determination of a bit error rate (BER) at a location (or cell) of such a memory.

PRIOR ART

Tests in high-frequency pulsed mode of resistance-based memories may enable, for example, to determine a binary error rate (BER) on these memories. The BER of a memory may be defined as being the number of write and/or read operation failures, divided by the total of write/or read operation attempts, in the same writing condition, on a given cell of a memory.

By high-frequency pulsed mode, there is meant a state of generation of pulses having widths typically in the range from a few hundreds of picoseconds to a few hundreds of nanoseconds, rated at a frequency greater than one kHz.

The required binary error rate is often very low. As an example, a BER in the range from $10^{-9}$ to $10^{-6}$ may be required for write operations. The detection of very small BER values requires a relatively large number of write operation attempts during the testing, which may require very long testing times.

SUMMARY OF THE INVENTION

There is a need to improve resistance-based memory testing techniques, and more precisely tests in high-frequency pulsed mode of such memories, in particular to decrease the durations of these tests.

For example, there is a need to improve techniques of determination of the binary error rate (BER) of a cell of such a memory.

An embodiment overcomes all or part of the disadvantages of known resistance-based memory testing techniques.

An embodiment provides a device for testing a resistance-change memory cell, the device comprising:

an electrically-conductive element adapted to coupling a cell to be tested to the testing device;

a signal generator adapted to generating signals for the writing into and for the reading from the cell;

a first transmission line adapted to coupling the generator and the conductive element in a first configuration intended to transmit a first signal for the writing into the cell;

a second transmission line, distinct from the first transmission line, adapted to coupling the generator and the conductive element in a second configuration intended to transmit a second signal for the reading from the cell;

a first amplifier comprising as an input a detection resistor;

an acquisition unit coupled to the output of the first amplifier;

the detection resistor of the first amplifier being positioned on said second transmission line; and a switching module adapted to coupling, in the first configuration, the generator and the conductive element via the first transmission line and, in the second configuration, the generator and the conductive element via the second transmission line.

Preferably, the testing device is external to the cell. In other words, the cell testing implements means external to the cell.

Preferably, the testing device is adapted to determining a resistance value of the cell.

According to a specific embodiment, the resistance value of the cell is determined based on the second signal, on the value of the detection resistance, and on a third signal measured at the output of the first amplifier by the acquisition unit when the second signal is generated.

According to an embodiment, the switching module comprises:

a first switch positioned between the generator and the first and second transmission lines, and adapted to coupling, in the first configuration, the generator to the first transmission line and, in the second configuration, the generator to the second transmission line; and a second switch positioned between the first and second transmission lines and the conductive element, and adapted to coupling, in the first configuration, the conductive element to the first transmission line and, in the second configuration, the conductive element to the second transmission line.

According to an embodiment, the switching module comprises at least one solid-state relay.

According to an embodiment, the conductor element is a test probe.

According to an embodiment, the signal generator is an arbitrary waveform generator, or an arbitrary signal generator, for example, a pulse generator.

According to an embodiment, the first amplifier comprises a differential amplifier.

According to an embodiment, the first amplifier is a current detection amplifier.

According to an embodiment, the testing device further comprises a second amplifier positioned between the signal generator and the first and second transmission lines.

According to an embodiment, the testing device further comprises an attenuator positioned on the second transmission line upstream of the detection resistor.

According to an embodiment, the value of the detection resistance is adapted to the impedance of the circuit between the generator and the second transmission line.

According to an embodiment, the value of the detection resistance is adapted to being modified, for example, varied, according to an expected value of the cell resistance.

According to an embodiment, the detection resistor is a variable resistor.

According to an embodiment, the detection resistor comprises a network of resistors having different resistance values. Preferably, the resistors of the resistor network are coupled to a switching system adapted to selecting a given resistor among the resistor network, for example, according to the expected resistance of the cell to be tested.

According to an embodiment, the acquisition unit comprises a digital multimeter, an oscilloscope, a digitizer and/or an acquisition card.

An embodiment provides a method of testing a resistance-change memory cell, the method comprising:

connecting the cell to a conductive element of a testing device;

actuating a switching module of the testing device to couple a signal generator of the testing device and the conductive element via a first transmission line of the testing device;

generating a first signal for the writing into the cell by means of the generator;

actuating the switching module to couple the generator and the conductive element via a second transmission line of the testing device, distinct from the first transmission line, and comprising a detection resistor at an input of a first amplifier of the testing device;

generating a second signal for the reading from the cell by means of the generator;

measuring a third signal at an output of the first amplifier by means of an acquisition unit of the testing device coupled to the output of said first amplifier;

determining a resistance value of the cell based on the third measured signal, on the second signal, and on the value of the detection resistance.

According to an embodiment, the first and the second signals are voltages, for example, voltage pulses, and the third signal is a voltage.

According to an embodiment, the memory is a magnetic memory, a phase-change memory, a resistive memory, or a memristor.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DESCRIPTION OF THE EMBODIMENTS

Figure 1:
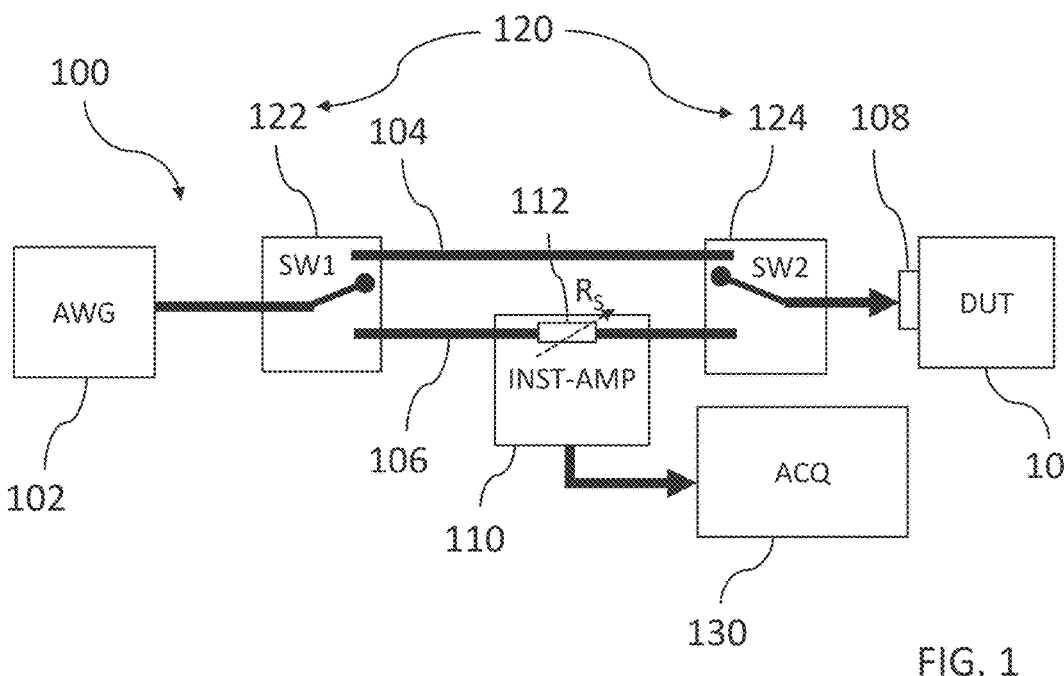
FIG. 1 very schematically shows in the form of blocks an embodiment of a memory testing device.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the generation of the write and read signals has not been detailed, the described embodiments being compatible with usual techniques for generating such signals.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

An example of a memory using distinct resistance states to store data is a magnetic random access memory (MRAM). According to an example of implementation, a MRAM memory comprises an array of cells, each of which comprises a magnetic tunnel junction (MTJ) formed of a pair of ferromagnetic layers separated by a thin insulating layer. A first ferromagnetic layer called "reference layer" or "fixed layer", is characterized by a magnetization with a fixed direction, and a second ferromagnetic layer, called "storage layer" or "free layer", is characterized by a magnetization with a direction which varies during the writing into the cell, for example, by applying a magnetic field to said cell, or a current or voltage pulse. A MRAM cell further generally comprises a first metal contact (or upper metal contact) and a second metal contact (or lower metal contact), the ferromagnetic and insulating layers being between the first contact and the second contact.

When the respective magnetizations of the reference layer and of the storage layer are antiparallel, the magnetic tunnel junction has a high resistance value, for example corresponding to a high logic state "1". However, when the respective magnetizations are parallel, the resistance of the magnetic tunnel junction is low, which then corresponds according to the example to a low logic state "0". According to another example, a high resistance value for example corresponds to a low logic state "0" and a low resistance value corresponds for example to a high logic state "1".

According to an example, the ratio of the resistance values between the two states (resistance value in antiparallel configuration to the resistance value in parallel configuration) is in the order of from 1.5 to 2.

To test an MTJ cell in high-frequency pulsed state, in particular to determine a binary error rate (BER) of said cell, the latter can be read by determining its resistance value, and in certain cases, by comparing the determined resistance value with a reference resistance value which may be a resistance value intermediate between that of the high logic state "1" and of the low logic state "0".

For example, the term high frequency in the case of a MRAM memory can be explained by the fact that a state change of a memory cell (write operation) may be performed by application, on the cell resistor, of current pulses, possibly induced by voltage pulses, in the order of from some hundred picoseconds to a few hundreds of nanoseconds, with rise times (transitions) pulses in the order of from a few tens of picoseconds to a few tens of nanoseconds. In this example, the pulse generation circuit has to exhibit a high cut-off frequency greater than 10 GHz. The low cut-off frequency is defined by the read operation, for which a quasi-static mode or, in other words, a much lower frequency, is commonly used. Thus, in read mode, a bias current may be applied to the cell in constant fashion during which the reading of the voltage is performed and this, for a duration between 1 microsecond to 10 milliseconds, the low operating frequency of the circuit then being from a few tens of Hz to a few tens of kHz.

The writing into a cell requires the application of a current, or of a voltage, having a sufficiently high amplitude between the first and second metal contacts of said cell, to induce a magnetic field which orients (switches) the free layer in the desired direction.

The reading from the cell to test it may be performed by a measurement of its electric resistance by applying a current, or a voltage, between the first contact and the second contact of said cell, having an amplitude lower than the amplitude of the current, or of the voltage, applied in write mode, so that the read operation does not modify the state of the cell during the testing.

To determine a BER by analog measurement of the cell resistance, there may be used a testing system comprising:

a first device of signal generation for the writing into a cell, for example, a pulse generator (PG), or an arbitrary waveform generator (AWG);

a second device of signal generation for the reading from the cell, for example, a sourcemeter or a source measure unit (SMU);

a test probe adapted to coming into electric contact with the cell and to applying to said cell a signal for the writing and a signal for the reading;

an electric measurement device, which may be an oscilloscope or a multimeter, for example, a digital multimeter (DMM), coupled to the second signal generation device and enabling to determine a resistance value of the cell in read mode.

For example, the PG generates a first write voltage pulse to have the cell switch to a low logic state "0", after which the SMU generates a first read voltage pulse having an amplitude smaller than that of the first write pulse and the DMM coupled to the SMU controls whether the cell has effectively switched to logic state "0" by determining a resistance value of the cell; then, the PG generates a second write voltage pulse to have the cell switch to a high logic state "1", after which the SMU generates a second read voltage pulse smaller than that of the second write pulse and the DMM coupled to the SMU controls whether the cell has effectively switched to logic state "1" by determining another resistance value of the cell.

This complete state "0" write/read/control—state-"1" write/read/control cycle, which is generally required to perform the test for each of the two cell states, may have a duration in the range from several tens of microseconds to a few milliseconds, for example, equal to approximately 500 microseconds (μs).

Now, to determine very small BERs, it may be necessary to perform a comparatively large number of write operation attempts during the testing, for example in the order of one million cycles for the testing of a single write/read test condition for a single memory cell, which results in that the testing of a cell may last for between several tens of seconds and several minutes, for example, approximately 500 seconds for one test condition (for example, a given amplitude and pulse width). Further, tests are generally performed on more than one cell, sometimes on from one to several hundreds of cells of a memory. Each of these cells is generally tested according to a set of a plurality of write/read parameters, for example, with a plurality of amplitudes and a plurality of pulse widths.

The inventors have attempted to shorten the duration of testing of a cell and of a memory, in particular to decrease the duration of a test cycle.

In particular, the inventors have realized that, to perform an analog resistance measurement during a BER test, the use of the three devices (PG, SMU, DMM) of the previously-described system makes it difficult to perform a complete cycle within less than a few hundreds of microseconds. One of the reasons for this is that the write (high frequencies) and read (low frequencies) lines are dissociated therein. Further, the measurement devices are altogether connected to the MTJ cell by alternating the application of the signal for the writing and of the signal for the reading, or by simultaneously applying them. Further, the testing requires synchronizing the devices with one another. Thus, one has to take into account the delays of initialization and of stabilization of the devices, particularly necessary on adjustment of the bias current, or voltage, generated by the SMU during the read operation subsequent to the write operation, given that the ratio of the resistance values between the two states may be in the order of a factor 1.5 to 2. The applied bias current or voltage should have a fixed value, and thus be adjusted to the value of the resistance of the current state of the MTJ cell (high resistance or low resistance state). This may require having significant latencies between pulses.

A variant of a testing system that may be used to improve the testing time and that addresses the issue of stabilizing the measurement source in read mode (of SMU type), may comprise a device of digital measurement on the read line and thus perform a binary measurement of the resistance, the principle being to compare the resistance of the tested cell with a reference resistance value, for example, by using a comparator amplifier, and thus to define the current state of the tested cell (logic state "1" or logic state "0"). The problem of this other system lies in the difficulty of defining the reference resistance value, for which it is necessary to perform tests with a plurality of reference values, which results in having to multiply tests. Further, this variant of a testing system generally does not enable to solve synchronization and initialization issues.

Thus, the previously-described testing systems enable to perform either an analog measurement of the cell resistance which requires a significant testing duration, or a binary measurement of the cell state, which enables to shorten the testing duration but which does not provide an analog measurement. In other words, the previously-described testing systems do not enable to combine an analog measurement and a short testing time.

The inventors provide a testing device and method enabling to address the previously-described improvement needs, and to overcome all or part of the previously-described disadvantages.

Embodiments of testing devices will be described hereafter. The described embodiments are non-limiting and various variants will occur to those skilled in the art based on the indications of the present disclosure.

FIG. 1 very schematically shows in the form of blocks an embodiment of a resistance-change memory cell testing device.

The cell to be tested (DUT) may for example be a MRAM cell with a magnetic tunnel junction (MTJ cell) such as that described hereabove, with two metal contacts.

The shown testing device 100 comprises:

an electrically-conductive element 108 adapted to coupling, preferably connecting, the cell 10 to be tested (DUT) to the testing device;

a signal generator 102 (AWG) adapted to generating signals for the writing into and for the reading from the cell;

a first transmission line 104 (write line) adapted to electrically coupling, preferably connecting, generator 102 and conductive element 108 in a first configuration intended to transmit a first signal for the writing into cell 10 (write configuration);

a first voltage-to-current amplifier 110 (INST-AMP) comprising, between its inputs, a detection resistor 112 ($R_S$);

an acquisition unit 130 (ACQ) coupled, preferably connected, to the output of first amplifier 110;

a second transmission line 106 (read line), distinct from first transmission line 104, adapted to electrically coupling, via detection resistor 112, generator 102 and conductive element 108 in a second configuration intended to transmit a second signal for the reading from cell 10 (read configuration);

a switching module 120 adapted to coupling, in the first configuration, the generator and the conductive element via the first transmission line and, in the second configuration, the generator and the conductive element via the second transmission line.

Switching module 120 enables to insulate the first and second transmission lines from each other, and in particular to disconnect the read line during phases of writing into the cell (in write configuration). This particularly enables to avoid for the read line to disturb the write line during phases of writing into the cell.

The shown switching module 120 comprises:

a first switch 122 (SW1) positioned between the generator and the first and second transmission lines, and adapted to coupling, preferably connecting, in the first configuration, generator 102 to first transmission line 104 and, in the second configuration, generator 102 to the second transmission line 106; and a second switch 124 (SW2) positioned between the first and second transmission lines and the conductive element, and adapted to coupling, preferably connecting, in the first configuration, conductive element 108 to first transmission line 104 and, in the second configuration, conductive element 108 to second transmission line 106.

Each switch may comprise, or be, a static relay or solid state relay (SSR). These relays are particularly adapted to performing fast switchings, that is, between some ten nanoseconds to approximately one microsecond, and have a lifetime much greater than electromechanical switches. This is particularly advantageous when a very large number of switchings have to be performed, as is the case for a binary error rate testing in high-frequency pulsed mode of a memory cell.

First amplifier 110 may comprise a differential amplifier, and/or an operational amplifier, having its inputs coupled by detection resistance 112. Since it is positioned on read line

106, detection resistor 112 is, in the second configuration, placed on the path of the current flowing through the memory cell to be tested.

Conductive element 108 may be a test probe, for example, a test probe comprising tips, a tip being adapted to coming into contact with a metal contact of the cell.

Signal generator 102 may be a generator of arbitrary waveforms or a generator of arbitrary signals, for example, a pulse generator. Advantageously, the signal generator has a sampling frequency ranging up to a few gigasamples per second (Gs/s), or even up to a few tens of gigasamples per second (Gs/s).

Acquisition unit 130 is adapted to acquiring, measuring, and/or processing the output voltage signal of first amplifier 110 (third signal), to determine a resistance value of the cell. The acquisition unit may comprise a digital multimeter, an oscilloscope, a digitizer, an acquisition card, and/or any other component adapted to performing the expected functions of said acquisition unit.

Figure 2A:
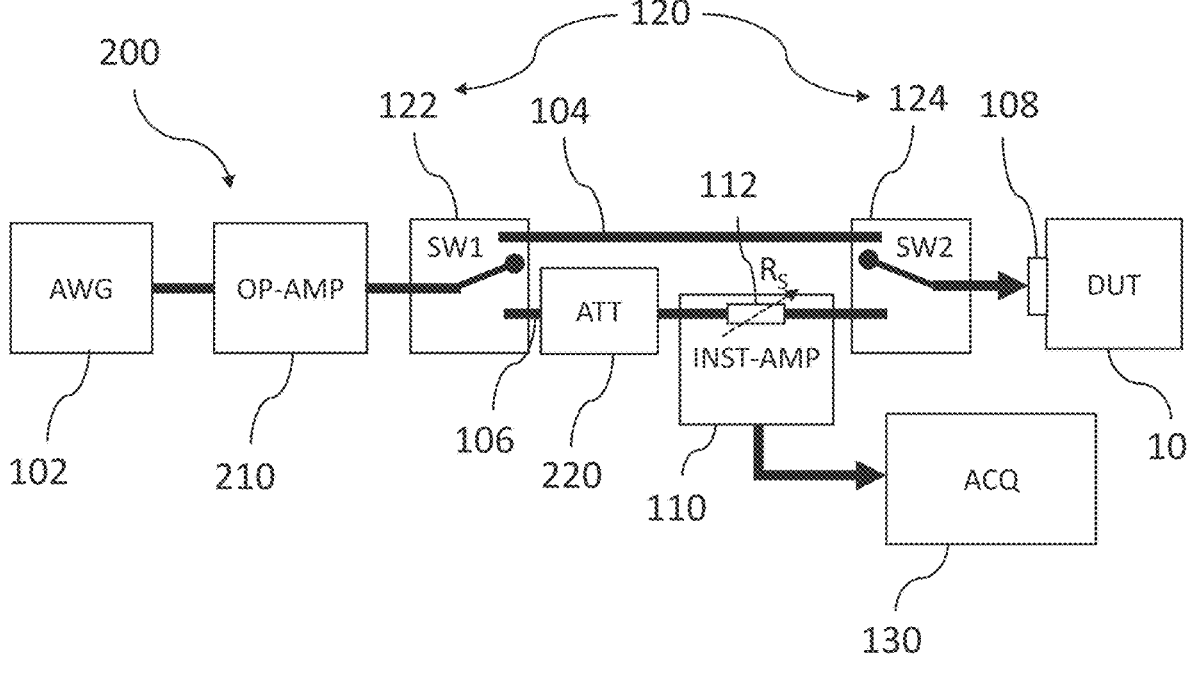
FIG. 2A very schematically shows in the form of blocks another embodiment of a memory testing device.

FIG. 2A very schematically shows in the form of blocks another embodiment of a device for testing a resistance-change memory cell.

The testing device 200 of FIG. 2A differs from the testing device 100 of FIG. 1 mainly in that it further comprises:

a second amplifier 210 (OP-AMP) positioned between signal generator 102 and first switch 122; and an attenuator 220 (ATT) positioned on the second transmission line 106, upstream of the detection resistor 112 of first amplifier 110.

The attenuator, installed on the read line, and combined with the second amplifier, opens the possibility of generating at the output of the second amplifier a signal having an amplitude greater than that desired on the cell. This enables to maximize the signal-to-noise ratio during the reading (a signal sufficient to maximize the signal-to-noise ratio at the output of the generator, and thus also at the output of the second amplifier, may be chosen), without adversely affecting the gain of this amplifier and thus the capacities in terms of amplitude and duration of the write signal.

According to an example, the second amplifier comprises, or is, an operational amplifier.

According to an embodiment (not shown), the second amplifier may form part of the generator.

According to an example, the attenuator comprises or is a passive attenuator, adapted at its inputs and outputs to 50-Ohm impedances over a wide frequency range, in the order of from a few kHz to some ten GHz.

The other elements of testing device 200 may be similar to the testing device 100 of FIG. 1, and the examples and variants of testing device 100 may also apply to testing device 200.

Advantageously, the value of detection resistor 112 may be modified, for example, varied, according to the expected value, or to a range around the expected value, of the resistance of the cell 10 to be tested, which is desired to be determined by means of the testing device. For example, detection resistor 112 is a variable resistor (shown by an oblique arrow in dotted lines in FIGS. 1 and 2A). As a variant, the detection resistor may comprise a network of resistors having different resistance values, and being coupled to a switching system adapted to selecting a given resistance from among the resistor network, according to the resistance of the cell 10 to be tested.

Figure 2B:
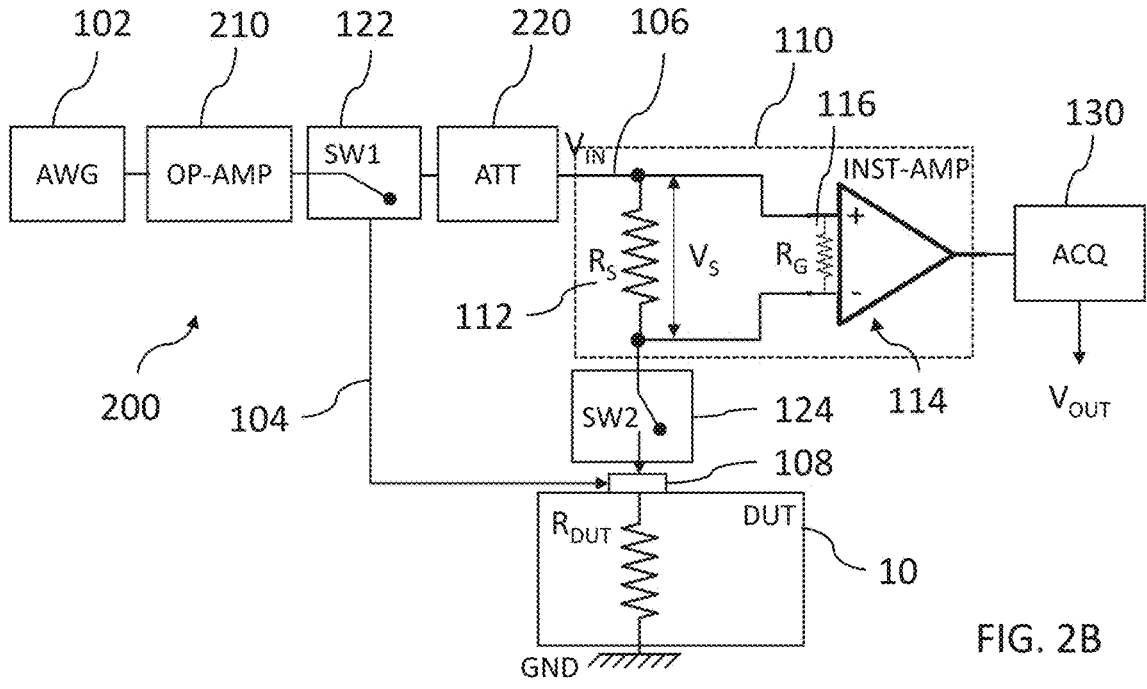
FIG. 2B schematically shows in the form of blocks and in more detailed fashion a testing device according to the embodiment of FIG. 2A.

FIG. 2B schematically shows in the form of blocks and in more detailed fashion a testing device 200 according to the embodiment of FIG. 2A. The following description may also apply to the testing device 100 according to the embodiment of FIG. 1, by suppressing the references to the second amplifier and to the attenuator.

The first shown amplifier 110 is a current detection amplifier which comprises, across detection resistor 112, an instrumentation amplifier circuit 114 which is configured to amplify the potential difference Vs across detection resistor 112 to obtain an output voltage signal $V_{OUT}$ (third signal) proportional to the current flowing through detection resistor 112, measurable by acquisition unit 130.

The ohmic value $R_G$ of the input resistor 116 of instrumentation amplifier circuit 114, which is electrically in parallel with detection resistor 112, is advantageously high, for example, greater than 10 MΩ, or even greater than 1 GΩ, to avoid affecting the measurement.

According to the example shown in FIG. 2B, cell 10 is coupled to ground GND, so that the cell is arranged between detection resistor 112 and the ground. The current detection amplifier is thus on the side of the highest potential of the assembly (high side).

Advantageously, the value $R_S$ of detection resistor 112 is accurately calibrated and/or is adapted to the impedance of the circuit upstream of said resistor, that it, at least to the impedance of generator 102 and to the impedance of the circuit between the generator and said resistor.

According to an example, the detection resistance has an ohmic value of approximately 50 ohms, for a 50-ohm standard impedance of the upstream circuit.

The value $R_{DUT}$ of the cell resistance conditions the current in the measurement line, and thus in detection resistor 112, and may be determined, knowing the value Rs of said detection resistor, based on input voltage $V_{IN}$, and based on the output voltage $V_{OUT}$ of the current detection amplifier. A non-limiting example of a formula enabling to determine a resistance value of the cell is given hereafter in relation with FIG. 3.

Figure 3:
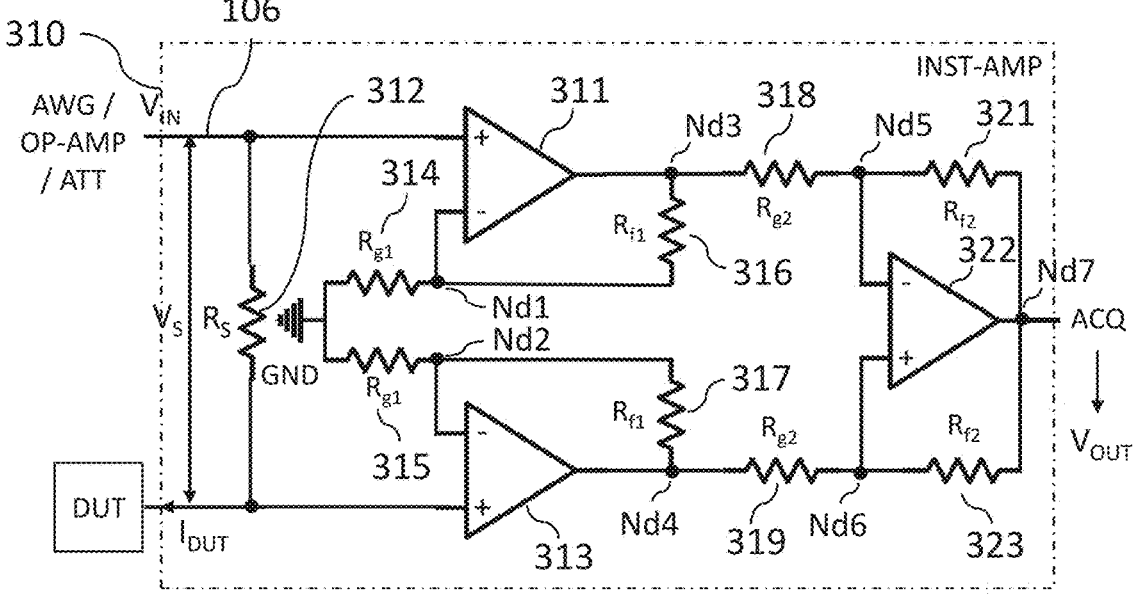
FIG. 3 shows an electric diagram, partially in the form of blocks, of a first amplifier of a testing device according to an embodiment.

FIG. 3 shows an electric diagram, partially in the form of blocks, of a current detection amplifier 310 of a testing device according to an embodiment.

Detection resistor 312 having an ohmic value $R_S$ is placed on the path of current $I_{DUT}$ flowing through the cell to be tested (DUT). Input voltage $V_{IN}$ is generated by the signal generator, possibly amplified by the second amplifier and attenuated by the attenuator in read line 106. Output voltage $V_{OUT}$ is processed by acquisition unit 130. Current detection amplifier 310 measures the voltage drop $V_s$ across detection resistor 312.

Detection resistor 312 is connected to the terminals of the respective positive, or non-inverting, inputs of a first operational amplifier 311 and of a second operational amplifier 313. The negative, or inverting, input (node Nd1) of first operational amplifier 311 is coupled to ground GND by a first resistor 314. The negative, or inverting, input (Nd2) of second operational amplifier 313 is coupled to ground GND by a second resistor 315. The first and second resistors have a same ohmic value $R_{g1}$.

The output of first operational amplifier 311 is coupled, preferably connected, to a third node Nd3, itself coupled to first node Nd1 via a third feedback resistor 316. The output of second operational amplifier 313 is coupled, preferably connected, to a fourth node Nd4, itself coupled to second node Nd2 via a fourth feedback resistor 317. The third and fourth resistors, or feedback resistors, have a same ohmic value $R_{f1}$.

Third node Nd3 is coupled to a fifth node N5 via a fifth resistor 318. Fourth node Nd4 is coupled to a sixth node N6 via a sixth resistor 319. The fifth and sixth resistors have a same ohmic value $R_{g2}$.

Fifth node N5 is coupled, preferably connected, to the negative input of a third operational amplifier 322, and the sixth node N6 is coupled, preferably connected, to the positive input of said third operational amplifier.

The output of third operational amplifier 322 is coupled, preferably connected, to a seventh node Nd7. This seventh node ND7 is coupled on the one hand to fifth node Nd5 via a seventh resistor 321, and on the other hand to sixth node Nd6 via an eighth resistor 323. The seventh and eighth resistors have a same ohmic value $R_{f2}$.

The value $R_{DUT}$ of the resistance of the cell (DUT) may be determined based on the voltage values at the input $V_{IN}$ and at the output $V_{OUT}$ of the current detection amplifier, on the ohmic value $R_S$ of detection resistor 312, and on the ohmic values $R_{f1}$, $R_{g1}$, $R_{f2}$, $R_{g2}$ of the other resistors by formula:

$$R_{DUT} = R_S \left( \frac{V_{IN}}{V_{OUT}} \left(1 + \frac{R_{f1}}{R_{g1}}\right)\left(1 + \frac{R_{f2}}{R_{g2}}\right) - 1 \right)$$

An example of embodiment of a current detection amplifier comprising a circuit with three operational amplifiers has been given. Other examples of circuits are possible, with three operational amplifiers, or for example with one or two operational amplifiers, or even more than three operational amplifiers, and those skilled in the art will also be capable of adapting the formula enabling to determine the resistance value $R_{DUT}$ of the cell according to the selected circuit.

Further, those skilled in the art will be capable of configuring the operational amplifiers, as well as the circuit, to comply with the desired performance of the current detection amplifier, for example, to have a very wide bandwidth, a gain stability, and/or a strong input impedance.

Figure 4:
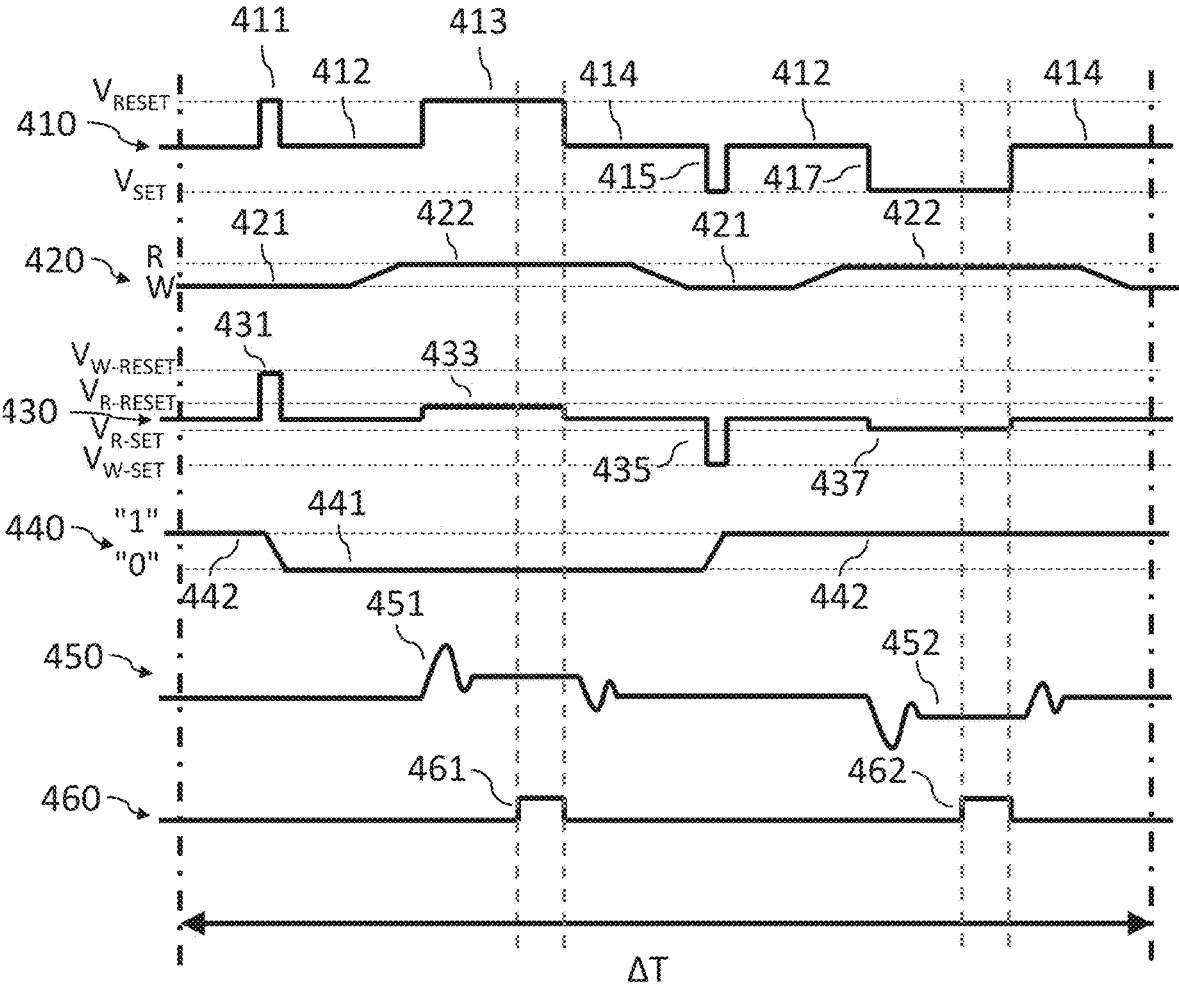
FIG. 4 shows an example of timing diagrams of a BER testing cycle in a testing method according to an embodiment.

FIG. 4 shows an example of timing diagrams showing a BER testing cycle in a testing method according to an embodiment.

Each timing diagram graphically shows the time variation of electric signals or states of elements of a testing device according to an embodiment, for example, the testing device 200 of FIGS. 2A and 2B.

A first timing diagram 410 shows the signals generated by the generator, possibly amplified by the second amplifier. The signals are in the form of voltage pulses. A voltage pulse is designated, as a shortcut, by the term pulse.

A second timing diagram 420 shows the state of the switching module. A low state corresponds to the write configuration (W), that is, the switching module is in a position enabling to couple the generator and the cell via the write line. A high state corresponds to the read configuration (R), that is, the switching module is in a position enabling to couple the generator and the cell via the read line.

A third timing diagram 430 shows the pulses received by the cell. In the write configuration, they are not attenuated while in the read configuration, they are attenuated by the attenuator.

A fourth timing diagram 440 shows the state of the cell: either a low logic state "0" 441, or a high logic state "1" 442.

A first positive write pulse 411, of amplitude $V_{RESET}$, is generated by the pulse generator. This pulse is received by the cell in the form of a pulse 431 of amplitude $V_{W-RESET}$ without being attenuated (write configuration) and is intended to take the cell to be switched to a low logic state "0".

Then, a second positive read pulse 413, of amplitude $V_{RESET}$, is generated by the pulse generator. This pulse is received by the cell in the form of a pulse 433 of attenuated amplitude $V_{R\text{-}RESET}$ (read configuration), smaller than amplitude $V_{W\text{-}RESET}$, to control whether the cell has effectively switched to logic state "0" by determining a resistance value of the cell.

Then, a third negative write pulse, of amplitude $V_{SET}$, is generated by the pulse generator. This pulse is received by the cell in the form of a pulse 435 of amplitude $V_{W\text{-}SET}$ without being attenuated (write configuration) and is intended to take the cell to be switched to a high logic state "1".

Then, a fourth negative read pulse 417, of amplitude $V_{SET}$, is generated by the pulse generator. This pulse is received by the cell in the form of a pulse 437 of attenuated amplitude $V_{R\text{-}SET}$ (read configuration), smaller than amplitude $V_{W\text{-}SET}$, to control whether the cell has effectively switched to logic state "1" by determining a resistance value of the cell.

A fifth timing diagram 450 shows the output signals of the first amplifier: a first output signal 451 corresponding to a positive pulse in read mode and a second output signal 452 corresponding to a negative pulse in read mode. The sign of the pulse is a function of the state "0" or "1" of the cell.

A sixth timing diagram 460 shows the signals acquired and measured by the acquisition unit at the output of the first amplifier. The acquisition is performed within an acquisition time window, represented by the vertical dotted lines, to measure stabilized output signals. This enables to generate a first measurement signal 461 corresponding to a positive read pulse and a second measurement signal 462 corresponding to a negative read pulse.

The measurement signal levels 461 and 462 of the sixth timing diagram enable to detect a state change of the resistance after the write pulse and to find, by calculation, the resistance value $R_{DUT}$ of the cell corresponding to logic state 1 or to logic state 0, for example, by using the previously-described equation.

Such as it is used here, the positive write pulse is supposed to make the cell switch from the high logic state "1" to a low logic state "0" and the negative write pulse is supposed to make the cell switch from the low logic state "0" to a high logic state "1". The low logic state corresponds to a low resistance of the cell and the high logic state corresponds to a high resistance of the cell. Other configurations are possible, and appropriate modifications are then to be made to the description and to FIG. 4, without for this to change the principles of the embodiments.

In the shown example, a read pulse received by the cell has an amplitude smaller than that of the write pulse received by the cell, this, to avoid for the read pulse to switch the magnetic tunnel junction of the cell, in other words so that it keeps the state of the cell supposed to be given by the write pulse (state which is desired to be verified by the reading). Further, the read pulse has a pulse width greater than that of the write pulse. This enables to manage the response time of the first amplifier and of the acquisition unit.

The width (duration) and the amplitude of the write pulses may be defined according to the specifications of the test cell.

According to a variant (not shown), the read pulse may have a pulse width substantially equal to that of the write pulse, with however, preferably, an amplitude smaller by at least one order of magnitude.

Between a write pulse and a read pulse, a first interval 412 is provided, which corresponds to a period during which the generator generates no write signal for a short time. Such an interval, which may be designated as relaxation interval, for example enables to leave a time of thermal relaxation of the free layer of the MTJ after the end of the write pulse. Similarly, between a read pulse and a write pulse, a second relaxation interval 414 is provided, which corresponds to a period during which, for example, the generator does not generate a read signal for a short time. Such an interval enables the switching module to change the path of the signal between the read line and the write line.

The complete BER testing cycle according to this example, delimited by two strip-dot vertical lines, has a duration $\Delta T$.

In the shown example, the signals generated for the writing and the reading are voltage pulses, but this is not limiting. As a variant, the signals may for example be current pulses.

There appears from the disclosure that a testing device according to an embodiment enables, by using a single signal generator both for the writing into and for the reading from a memory cell, to decrease the duration of a test cycle, particularly by decreasing synchronization delays between devices. The use of a switching module enables, for example, to decouple the write line from the read line, while a single signal generator is used.

Further, the testing device according to an embodiment enables to do away, in read mode, with a current or voltage biasing in quasi-static mode during the test cycle, which enables to do away with stabilization delays relative to the state changes of the magnetic tunnel junction. This for example enables to considerably decrease the relaxation intervals between write and read pulses and between read and write pulses.

Provided to have a sufficiently large bandwidth of the first amplifier, the inventors have determined that it was possible to decrease the duration $\Delta T$ of a complete test cycle by a factor in the range from approximately 10 to 1,000, for example from approximately 50 to 100. This for example enables to decrease the duration of a complete BER test cycle to less than 5 microseconds instead of 500 microseconds, and to carry out one million cycles within approximately 5 seconds.

Further, by recovering a resistance value of the cell, analog data may be recovered, which allows a finer data analysis than when only digital data, typically the state "0" or "1" of the cell, are recovered, with a testing duration equivalent to a digital testing duration. This for example enables to define, in the post-processing of the recovered data, a finer threshold resistance value, and to minimize write errors. This for example enables to do away with generally very long trimming steps carried out on memory components. In other words, the testing device according to an embodiment enables to perform a memory cell resistance measurement, and thus to perform an analog measurement (and not only in binary fashion) and this, more rapidly than other analog testing systems.

According to a variant, it may not be desired to know the resistance value of the cell. For example, there may be provided a comparison circuit which, based on the voltage signal determined at the output of the first amplifier, and by comparing it with a reference voltage value, enables to directly convert the resistance into a logic state of the cell, particularly enabling to further decrease the duration of a test cycle.

The detailed description of the embodiments takes as an example a MRAM memory with a magnetic tunnel junction (MTJ) as an example, but the embodiments should be understood as more generally applying to the category of resistance-change memories, which includes in a particular another type of MRAM memory, a phase-change RAM memory (PCRAM), a resistive RAM memory (RRAM), and/or a memristor. According to an example, it may be a RAM memory of spin transfer torque type (STT), or of spin-orbit torque type (SOT).

Further, the detailed description describes tests for the determination of a binary error rate (BER) of such a memory, but other tests in high-frequency pulsed mode of such memories may be carried out, such as for example tests R (V) of amplitude scanning at constant pulse width, to extract the switching voltages, or life tests, such as for example tests consisting of applying a very large number of write pulses, typically greater than $10^9$, to estimate the reliability of the MTJ cell over time and to extrapolate therefrom a lifetime specification.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove.

The invention claimed is:

1. Device for testing a resistance-change memory cell, the device comprising:
   an electrically-conductive element configured to couple a cell under test to the testing device;
   a signal generator configured to generate signals for the writing into and for the reading from the cell;
   a first transmission line configured to couple the generator and the conductive element in a first configuration to transmit a first signal for the writing into the cell;
   a second transmission line, distinct from the first transmission line, configured to couple the generator and the conductive element in a second configuration to transmit a second signal for the reading from the cell;
   a first amplifier comprising as an input a detection resistor;
   an acquisition unit coupled to the output of the first amplifier;
   the detection resistor of the first amplifier being positioned on said second transmission line; and
   a switching module configured to couple, in the first configuration, the generator and the conductive element via the first transmission line and, in the second configuration, the generator and the conductive element via the second transmission line;
   the testing device is external to the cell, and is configured to determine a resistance value of the cell;
   wherein the resistance value of the cell is determined based on the second signal, on the value of the detection resistor, and on a third signal measured at the output of the first amplifier by the acquisition unit when the second signal is generated.

2. Device according to claim 1, wherein the switching module comprises:
   a first switch positioned between the generator and the first and second transmission lines, and configured to couple, in the first configuration, the generator to the first transmission line and, in the second configuration, the generator to the second transmission line; and
   a second switch positioned between the first and second transmission lines and the conductive element, and configured to couple, in the first configuration, the conductive element to the first transmission line and, in the second configuration, the conductive element to the second transmission line.

3. Device according to claim 1, wherein the switching module comprises at least one solid-state relay.

4. Device according to claim 1, wherein the conductive element is a test probe.

5. Device according to claim 1, wherein the signal generator is an arbitrary waveform generator, or an arbitrary signal generator, for example a pulse generator.

6. Device according to claim 1, wherein the first amplifier comprises a differential amplifier.

7. Device according to claim 1, wherein the first amplifier is a current detection amplifier.

8. Device according to claim 1, further comprising a second amplifier positioned between the signal generator and the first and second transmission lines.

9. Device according to claim 1, further comprising an attenuator positioned on the second transmission line upstream of the detection resistor.

10. Device according to claim 1, wherein the value of the detection resistor is configured to be modified, for example, varied, according to an expected value of the cell resistance, for example, the detection resistor is a variable resistor, or the detection resistor comprises a network of resistors having different resistance values.

11. Device according to claim 1, wherein the value of the detection resistor is adapted to the impedance of the circuit between the generator and the second transmission line.

12. Device according to claim 1, wherein the acquisition unit comprises a digital multimeter, an oscilloscope, a digitizer, and/or an acquisition card.

13. Device according to claim 1, wherein the first and the second signals are voltages, for example, voltage pulses, and the third signal is a voltage.

14. Device according to claim 1, wherein the memory is a magnetic memory, a phase-change memory, a resistive memory, or a memristor.

15. Method of testing a resistance-change memory cell, the method comprising:
   connecting the cell to a conductive element of a testing device;
   actuating a switching module of the testing device to couple a signal generator of the testing device and the conductive element via a first transmission line of the testing device;
   generating a first signal for the writing into the cell by means of the generator;
   actuating the switching module to couple the generator and the conductive element via a second transmission line of the testing device, distinct from the first transmission line, and comprising a detection resistor at an input of a first amplifier of the testing device;
   generating a second signal for the reading from the cell by means of the generator;
   measuring a third signal at an output of the first amplifier by means of an acquisition unit of the testing device coupled to the output of said first amplifier;
   determining a resistance value of the cell based on the third measured signal, on the second signal, and on the value of the detection resistor.

16. Method according to claim 15, wherein the first and the second signals are voltages, for example, voltage pulses, and the third signal is a voltage.

17. Method according to 15, wherein the memory is a magnetic memory, a phase-change memory, a resistive memory, or a memristor.

\* \* \* \* \*